United States Patent [19]
Omatsu

[11] Patent Number: 5,196,757
[45] Date of Patent: Mar. 23, 1993

[54] MULTILAYER PIEZOELECTRIC CERAMIC ACTUATOR

[75] Inventor: Kenichi Omatsu, Tokyo, Japan

[73] Assignee: NEC Corporation, Tokyo, Japan

[21] Appl. No.: 859,988

[22] Filed: Mar. 30, 1992

[30] Foreign Application Priority Data

Mar. 28, 1991 [JP] Japan .................................. 3-064235

[51] Int. Cl.$^5$ .......................................... H01L 41/08
[52] U.S. Cl. .................................... 310/358; 310/328; 310/366; 310/363; 310/364
[58] Field of Search .................... 310/328, 363–366

[56] References Cited

FOREIGN PATENT DOCUMENTS

| | | | |
|---|---|---|---|
| 0196069 | 11/1983 | Japan | 310/366 |
| 0519777 | 7/1986 | Japan | 310/364 |
| 0182285 | 8/1986 | Japan | 310/366 |
| 0216493 | 9/1986 | Japan | 310/363 |
| 0132381 | 6/1987 | Japan | 310/363 |
| 0248576 | 10/1989 | Japan | 310/363 |

*Primary Examiner*—Mark O. Budd
*Attorney, Agent, or Firm*—Leydig, Voit & Mayer

[57] ABSTRACT

A piezoelectric ceramic actuator having a laminated body obtained by alternately laminating a plurality of piezoelectric ceramic layers and a plurality of internal electrode layers in which at least one part of two adjacent ceramic layers, having the internal electrode sandwiched therebetween, are bonded to each other through particles of ceramic powder contained within the internal electrode. As a result of this structure, the bonding strength between the ceramic layer and the internal electrode can be greatly increased compared with conventional designs, thus improving the impact resistance of the actuator. The average particle size of the ceramic powder contained within the internal electrode ranges from one-third to one times (preferably from one-half to one times) the thickness of the internal electrode, and the mixing ratio of the ceramic powder ranges from 10 to 20 weight percent to electroconductive materials within the internal electrode.

21 Claims, 4 Drawing Sheets

MULTILAYER PIEZOELECTRIC CERAMIC ACTUATOR

BACKGROUND OF THE INVENTION

1. Field of the Invention

This invention relates to a multilayer piezoelectric ceramic actuator and more particularly, to an improvement of internal electrode structure thereof.

2. Description of the Prior Art

In general, the multilayer piezoelectric ceramic actuator has a laminated body that is formed by alternately laminating a plurality of piezoelectric ceramic layers and a plurality of internal electrode layers. On each of the two opposing side surfaces of the laminated body (for example, right and left side surface thereof), a glass insulator is coated onto the exposed edges of the internal electrodes on one of the opposite side surface to cover their linear edges. In this way, the glass insulators are provided on the edges of the internal electrodes arranged in the laminating direction and alternately disposed on the opposing side surfaces of the laminated body. On the opposing side surfaces of the laminated body having provided with the glass insulators, external electrode layers are respectively formed covering the glass insulators and connecting every other internal electrode on each of the opposing surfaces. The external electrodes thus formed have the lower ends respectively connected to lead wires by soldering to form a lead wire pair. The laminated body, including the external electrodes, is contained in a resin case for armoring.

With the multilayer piezoelectric ceramic actuator thus prepared, if a voltage is applied across the ends of the lead wire pair, it is applied through the external electrodes respectively to the internal electrodes. As a result, one piezoelectric ceramic layer sandwiched between internal electrodes deforms in the thickness direction thereof in accordance with the voltage applied. The deformations induced in respective ceramic layers as shown above are accumulated, and the actuator itself has a displacement induced in the laminating direction. This displacement is controlled by the voltage applied.

As explained above, the laminated type ceramic actuator has internal electrodes which are respectively sandwiched between ceramic layers. Thus, the ceramic layers are isolated with no bonding to each other. As a result, the bonding strength between the internal electrode and ceramic layer is not so large. Thus, if a tension is applied in the laminating direction, a fracture may occur at the interface between the internal electrode and the ceramic layer.

One method for solving the above problem, as disclosed, for example, in Japanese Laid-Open Patent Application No. 62-132381, is to increase the bonding strength between the internal electrode and ceramic layer by mixing a ceramic powder of the same kind as that of the ceramic layer into the internal electrode. Mixing ceramic powder into the internal electrode increases the contact area between the internal electrode and ceramic layer, utilizing the "anchor effect", thus increasing the bonding strength therebetween. Conventionally, the average particle size of the ceramic powder to be used for this purpose is considerably smaller than a thickness of the internal electrode, being not more than a quarter the thickness thereof.

According to the above-mentioned proposal, the bonding strength therebetween can be approximately doubled as compared with that obtained when not mixing the ceramic powder thereinto. In the conventional apparatus described above, a bonding strength cannot be attained that is equivalent to the strength that the ceramic layer has inherently. Thus, the problem of a fracture occurring at the interface between the internal electrode and the ceramic layer due to tension applied to the actuator in the laminating direction still remains to be solved.

Thus, an object of this invention is to provide a stack type ceramic actuator having a bonding strength between a ceramic layer and an internal electrode higher than that of being proposed as described above and a higher reliability for application of an impact force.

SUMMARY OF THE INVENTION

In a first aspect, a multilayer piezoelectric ceramic actuator of this invention has a plurality of piezoelectric ceramic layers and a plurality of internal electrode layers, which are laminated in an alternate manner, and at least onepart of two adjacent ceramic layers having an internal electrode sandwiched therebetween are bonded through the ceramic particles contained within the internal electrode to each other. The two adjacent ceramic layers having an internal electrode sandwiched therebetween are bonded to each other through the ceramic particles contained within the internal electrode. As such, the bonding strength between the ceramic layer and the internal electrode can be greatly increased compared with conventional bonding techniques, resulting in an improvement in impact resistance.

In a second aspect, a multilayer piezoelectric ceramic actuator of this invention is characterized in that the average particle size of a ceramic powder to be mixed into an internal electrode is ranged from one-third to one times a thickness of the internal electrode, and the mixing ratio of the ceramic powder is varied between 10 to 20 weight percent (%) to an electroconductive material used to form the internal electrode. In the second aspect, for the same reason as in the first aspect, a large bonding strength can be obtained between the ceramic layer and the internal electrode, thus resulting in an improvement in the impact resistance.

When the average particle size of the ceramic powder to be mixed is smaller than one-third the thickness of the internal electrode, the bonding strength cannot be satisfactorily obtained between the ceramic layer and the internal electrode. On the other hand, when the particle size is larger than the thickness of the internal electrode the internal electrode is difficult or impossible to form. This is because the internal electrode is generally formed by printing a paste containing an electroconductive material onto the ceramic layer by a screen printing method. When the particle size is larger than the thickness of the internal electrode, a satisfactory printing result cannot be obtained, or the printing itself becomes difficult or impossible to achieve. In addition, when the mixing ratio of the ceramic powder does not exceed 10 weight percent (%), the bonding strength according to this invention cannot be effectively obtained. However, when it exceeds 20 weight percent (%), the electrical characteristics of the actuator obtained are adversely effected.

The average particle size of the ceramic powder to be mixed into the internal electrode is preferably in the range of one-half to one times the thickness of the internal electrode, thus obtaining a satisfactory bonding strength over this whole range.

When the average particle size of the ceramic powder is one times the thickness of the internal electrode, the ceramic powder has a particle size distribution such that the ceramic powder contains some particles having a particle diameter larger than the thickness of the internal electrode. Some particles will be protruded from one or either surfaces of the internal electrode. These protruding particles are bonded to the ceramic layer or ceramic layers by sintering, thus avoiding any adverse effects on the characteristics of the actuator.

The average particle size of the ceramic powder can be determined by various methods. As an example, measurements can be made for determining the diameter of each particle of the ceramic powder ally, sieves may be made in various mesh sizes. When ceramic particles with a specific diameter are contained in the ceramic powder to exceed 50 weight percent (%), the specific diameter is defined as the average particle size of this ceramic powder.

In the piezoelectric ceramic actuators shown in the first and second aspects of this invention, it is preferable that the ceramic powder mixed into the internal electrode is the same as a piezoelectric ceramic material used for the piezoelectric ceramic layer. However, the invention is not limited thereto, and ceramic material different therefrom may be used. The use of the same piezoelectric ceramic material facilitates a higher bonding strength between the ceramic layer and the internal electrode compared with the use of different ceramic materials.

Materials used for forming the ceramic layer are not limited, and any ceramic material may be used for this purpose if it is a piezoelectric or electrostrictive material. Similarly, the material to be used for forming the internal electrode is not limited, and any mixture including a mixture of silver and palladium particles may be used. In addition, the method of mixing the ceramic powder into the internal electrode and the method of forming the internal electrode are not limited. It is satisfactory if at least one part of two adjacent ceramic layers having an internal electrode sandwiched therebetween are bonded to each other through the ceramic particles contained within the internal electrode.

PREFERRED EMBODIMENTS OF THE INVENTION

Preferred embodiments of this invention will be described below while referring to the drawings.

Figure 1:
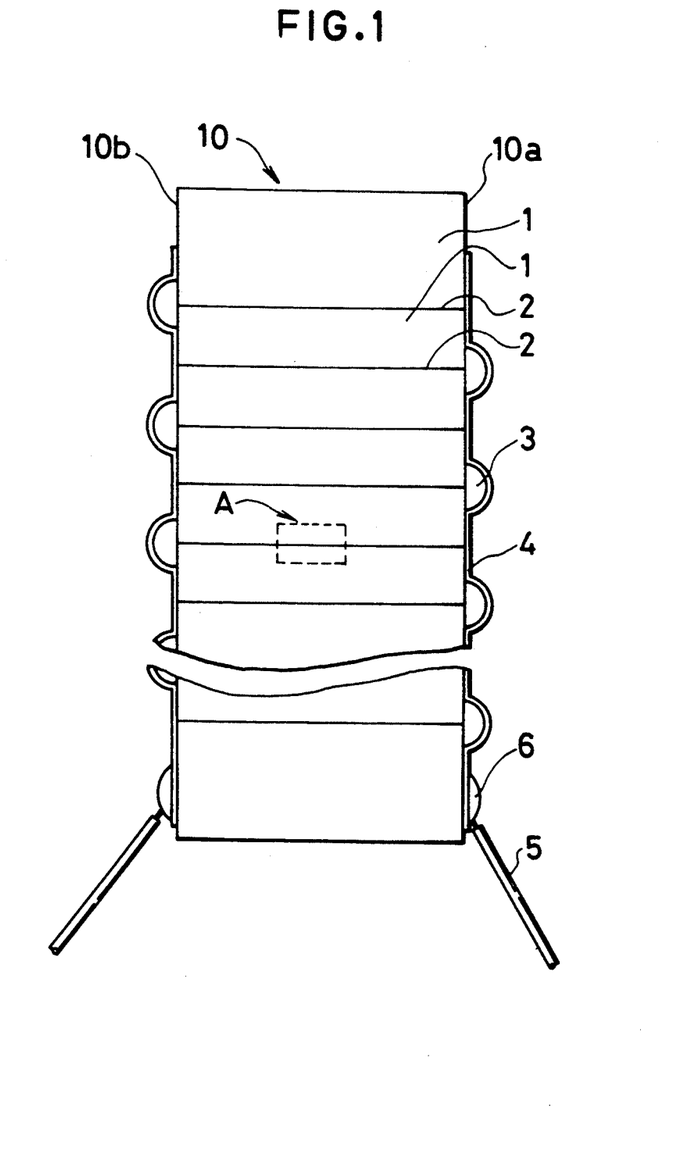
FIG. 1 is a cross-sectioned structural view of a multilayer piezoelectric ceramic actuator according to one embodiment of this invention.

As shown in FIG. 1, a multilayer ceramic actuator utilizing a piezoelectric effect according to one embodiment of this invention has a laminated body 10. The laminated body 10 is formed by alternately laminating a plurality of ceramic layers 1, each of which is rectangular-shaped and made of a piezoelectric ceramic material with a plurality of internal electrodes 2, each of which is formed of a film having the same shape as that of the ceramic layer 1. In this embodiment, the ceramic layer 1 is formed of a piezoelectric ceramic powder consisting mainly of lead titanate zirconate, $Pb(Ti,Zr)O_3$, (so-called PZT), and the internal electrode 2 is formed of a mixture which is obtained by mixing the same piezoelectric ceramic powder as that of the ceramic layer 1 into a silver-palladium powder mixture. The ceramic layer 1 has a thickness of about 130 $\mu$m, excepting those disposed at the upper and lower ends of the laminated body 10, which are made larger in thickness than the remainder. The internal electrode 2 has a thickness of about 6 $\mu$m.

The four edges of the rectangular-shaped internal electrode 2 are exposed to respective side surfaces of the laminates body 10. Out of which, two sides surfaces 10a and 10b opposing each other on the laminated body 10 have the edge of the internal electrodes 2 bondingly covered with glass insulators 3 alternatively provided on each of the side surfaces 10a and 10b, it is alternately provided along the linear edges of the internal electrodes 2 disposed in the lamination direction.

A film-shaped external electrode 4 is formed on each of the side surfaces 10a and 10b while covering the glass insulators 3 thereby connecting the internal electrodes 2 in parallel. The lower end of each of the external electrodes 4 thus formed has a lead wire 5 fitted with a solder 6 to make a lead wire pair. The laminated body 10 is cased inclusively the external electrodes 4 by a resin (not shown).

With the actuator structured as above, if a voltage is applied across the ends of the lead wire pair 5, it is applied via the external electrodes 4 to respective internal electrodes 2, so that one ceramic layer 1 sandwiched between the internal electrodes 2 deforms in the thickness direction thereof. Such deformations as induced in respective ceramic layers 1 are accumulated, so that the actuator is induced a displacement in the laminating direction in accordance with the voltage to be applied.

Figure 2:
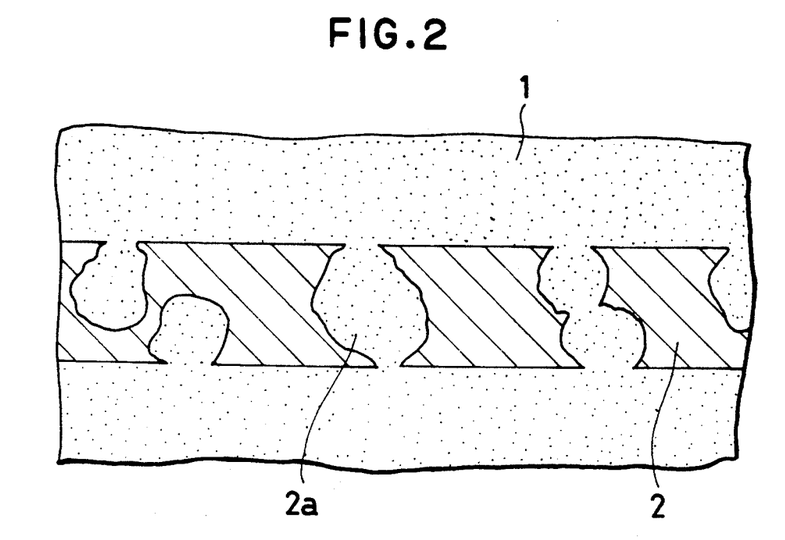
FIG. 2 schematically illustrates the area A of the actuator shown in FIG. 1.

The piezoelectric actuator of this embodiment structured as above has the internal electrode 2 different from that of a conventional one in that the internal electrode 2 of this embodiment mixingly contains a ceramic powder having the average particle size of 3 to 6 $\mu$m and the mixing ratio of 10 to 20 weight percent (%) to a silver-palladium powder mixture. This acreage particle size is equivalent to a half to one time the thickness (6 $\mu$m) of the internal electrode 2. The acreage particle size of the ceramic powder to be mixed therewith is designed described above. As shown in FIG. 2, a ceramic particle 2a is connected to the adjacent ceramic layer or layer 1 at the upper and/or lower surface of the internal electrode 2. This means that the ceramic particle 2a is included so as to provide a crosslink between the two adjacent ceramic layers 2. in this embodiment, the ceramic particle 2a and the ceramic layer 2 are of the same kind of ceramic and bonded by sintering to each other. This results in an extremely high bonding strength. As a result, there is no concern that a tension force will result in a fracture at the interface between the ceramic layer 1 and the internal electrode 2.

Figure 3:
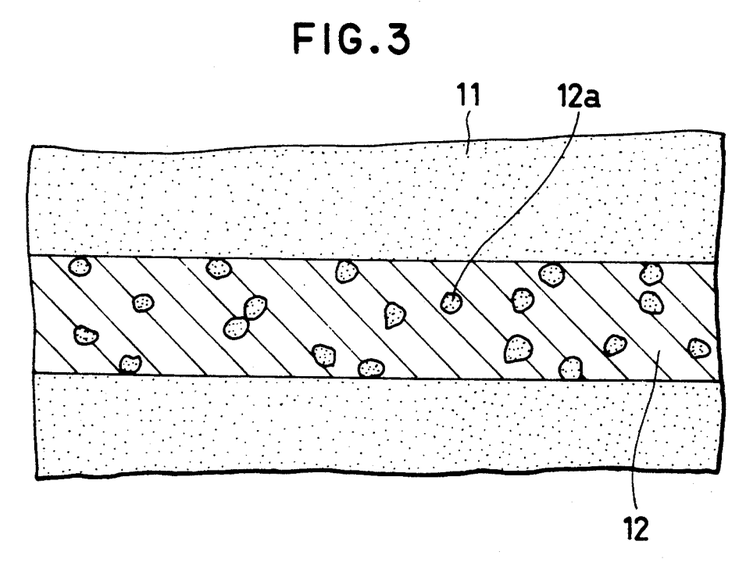
FIG. 3 schematically illustrates one area of a conventional multilayer ceramic actuator corresponding to the area A of the actuator shown in FIG. 1.

For comparison purposes, a conventional piezoelectric actuator is schematically cross-sectionally illustrated in FIG. 3. The conventional actuator shown in FIG. 3 has the average particle size of 1.5 μm of a ceramic powder 12a to be mixed into an internal electrode 12, which is equivalent to a quarter the thickness (6 μm) of the internal electrode 12. The conventional piezoelectric actuator shown above has the same structure as that of the embodiment of this invention excepting that the average particle size of the ceramic powder 12a is smaller than that of this embodiment.

As seen from FIG. 3, the conventional one is smaller in the average particle size of the ceramic powder 12a, so that the ceramic particles 12a are substantially uniformly dispersed into the internal electrode 12, which means that there does not exist such a ceramic particle 12a that allows the adjacent ceramic layers 12 to crosslink thereby to bond to each other, In addition, the number of the ceramic particles 12a contributing to effecting the anchor effect is small.

An example of a production method of the piezoelectric actuator according to the embodiment shown above will be explained below.

First, an appropriate piezoelectric ceramic powder consisting mainly of, for example, lead titanate zirconate, $Pb(Ti,Zr)O_3$ is mixed with a small amount of an organic binder, and dispersed into an organic solvent to prepare a slurry. The slurry thus prepared is formed in a sheet having a thickness of about 130 μm by a tapecast method or the like, thus obtaining a green sheet of piezoelectric ceramic.

Next, the same piezoelectric ceramic powder as used to make the piezoelectric green sheet is mixed into the powder mixture obtained by mixing silver powder and palladium powder at a mixing ratio of 7:3, and then, kneaded with a vehicle to obtain a paste for making an internal electrode. in this case, the ceramic powder to be mixed into the silver-palladium powder mixture is prepared so as to have the average particle size ranging from 3 to 6 μm (being half to one time the thickness of the internal electrode after being sintered), and the mixing ratio of the ceramic powder to the silver-palladium powder mixture ranges from 10 to 20 weight percent (%). Subsequently, the paste thus prepared is applied one surface of the piezoelectric green sheet obtained as shown above to print a film with a thickness of about 10 μm thereon by a screen printing method, thus obtaining a film-shaped internal electrode.

Next, 30 piezoelectric green sheets each not having the paste printed, 120 piezoelectric green sheets each having the paste printed, and 30 piezoelectric green sheet each not having the paste printed are laminated in this order to obtain a laminated body. The laminated body thus obtained is heated under the application of a pressure of 200 kg/cm² and sintered at about 1100° C. for two hours. As a result, the laminated body has the piezoelectric layers bonded integrally with each other, so that the piezoelectric green sheets make the ceramic layers 1 and the paste films formed thereon are shrunk to become the internal electrodes 2 each with a thickness of about 6 μm, respectively.

Next, the glass insulator 3 is alternatively provided on each of the opposing side surfaces 10a and 10b of the laminated body 10 along the exposed linear edges of the internal electrodes 2, alternately provided on the side surfaces 10a and 10b to expose one internal electrode therebetween. In addition, on each of the side surfaces 10a and 10b, a paste consisting mainly of silver is provided by a screen printing method or the like, covering the glass insulators 3. The silver is then dried and thereafter sintered at 600° C. for ten minutes, thus forming the external electrodes 4. Thereafter, each lead wire 5 is connected through a solder 6 to the lower end of the external electrode 4, thus forming the lead wires 5 in pair. The laminated body thus obtained is coated with resin (not shown). Thus, the piezoelectric actuator as shown in FIG. 1 is produced.

Several piezoelectric actuators according to this invention were prepared by the above-described method, in which the piezoelectric ceramic powder provided in the internal electrode has an average particle size of about 4.5 μm and a mixing ratio of 15 weight percent (%) to the silver-palladium powder mixture. In addition, an equal number of conventional piezoelectric actuators were prepared in the same method except that the piezoelectric ceramic powder within the internal electrode had an average particle size of about 1.5 μm. Then, microscopic observations were made for analyzing the internal structure of the vicinities of interfaces between the ceramic layers and internal electrodes. It was observed the ceramic particles 2a make a crosslink between the two adjacent ceramic layers 1 having the internal electrode 2 sandwiched therebetween as shown in FIG. 2 in case of using the specimens of this invention. On the other hand, the ceramic particles 12a are dispersed thereinto as shown in FIG. 3 in case of using the specimens of the prior art.

Next, a tension test was performed on the specimens of both specimens in order to measure their tensile strength by applying a tension in the laminating direction. The result was that the specimens of this invention have a tensile strength of about 26 kg/mm² and the specimens of the prior art have a tensile strength of about 15 kg/mm². As a result, it has been confirmed that the actuator of this invention has a tensile strength about 1.7 times that of the actuator of the prior art. Also, the specimens of the both were forcibly fractured by applying an excess amount of tension thereto, and their fracture states were observed. When testing the specimens of this invention, the specimens having a fracture occurring at the interface between the ceramic layer and internal electrode and those having a fracture occurring at the inside of the ceramic layer are about the same in number. This means that the bonding strength at the interface is substantially equal to that of the ceramic. On the other hand, the specimens of the prior art were all fractured from the interface between the ceramic layer and the internal electrode.

Figure 4:
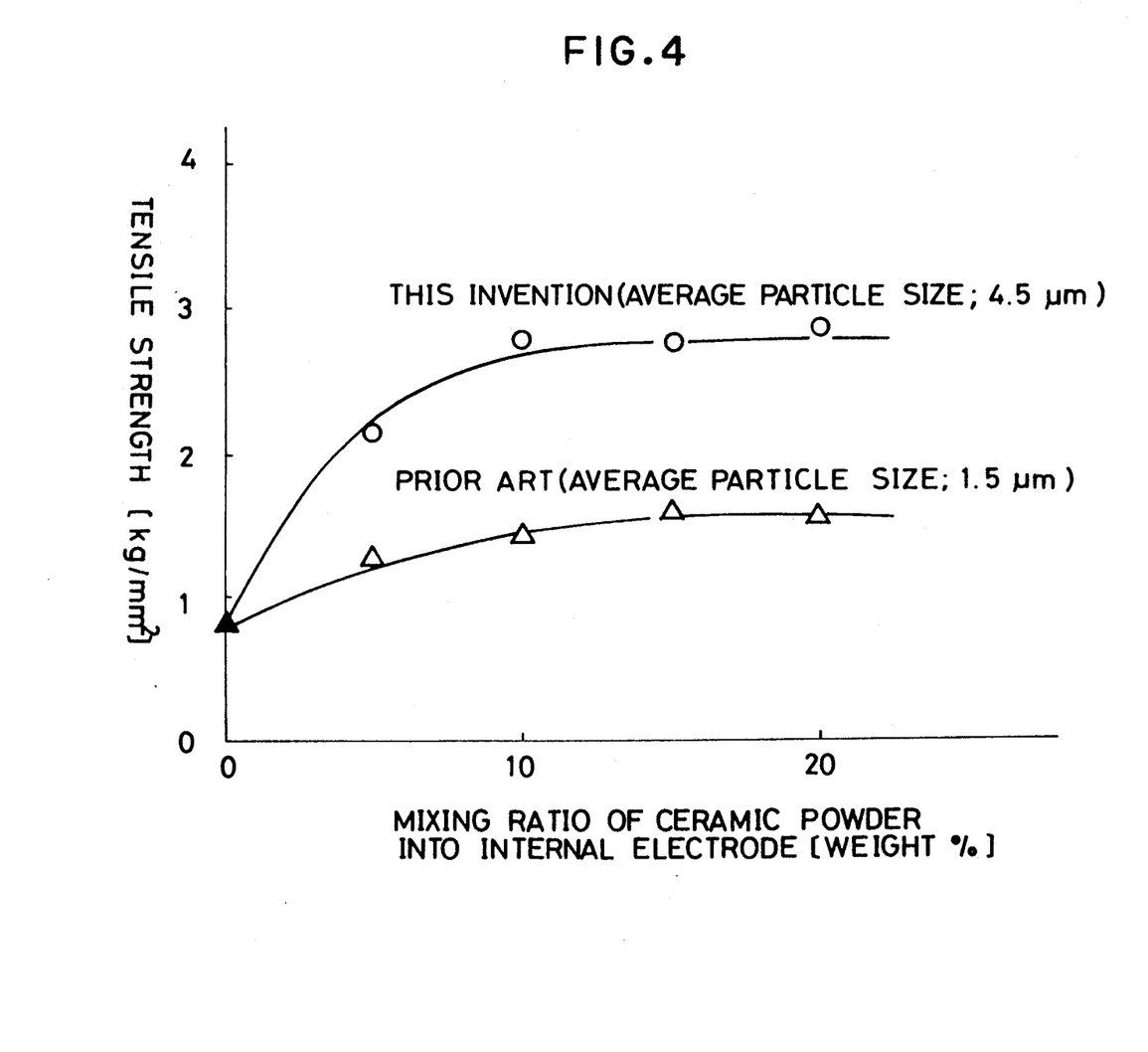
FIG. 4 shows a relation of a mixing ratio of ceramic powder into an internal electrode and a tensile strength of the actuator shown in FIG. 1 in comparison with that of a conventional one.

Next, the tensile strengths of the both specimens were analytically measured by changing the mixing ratio of the ceramic powder to be contained within the internal electrode, the results of which are shown in FIG. 4. Fig. 4 illustrates the improved results that can be obtained when the ceramic powder is added to the electroconductive material as the internal electrode at a mixing ratio of 10 to 20 weight percents (%). When the ceramic powder was added at a mixing ratio exceeding 25 weight percent (%), an electric resistance of the internal electrode increased and, the electric characteristics of the actuators were degraded. This is probably due to the fact that the composition ratio of the electroconductive material of the internal electrode is largely decreased by increasing the mixing ratio of the ceramic powder.

Figure 5:
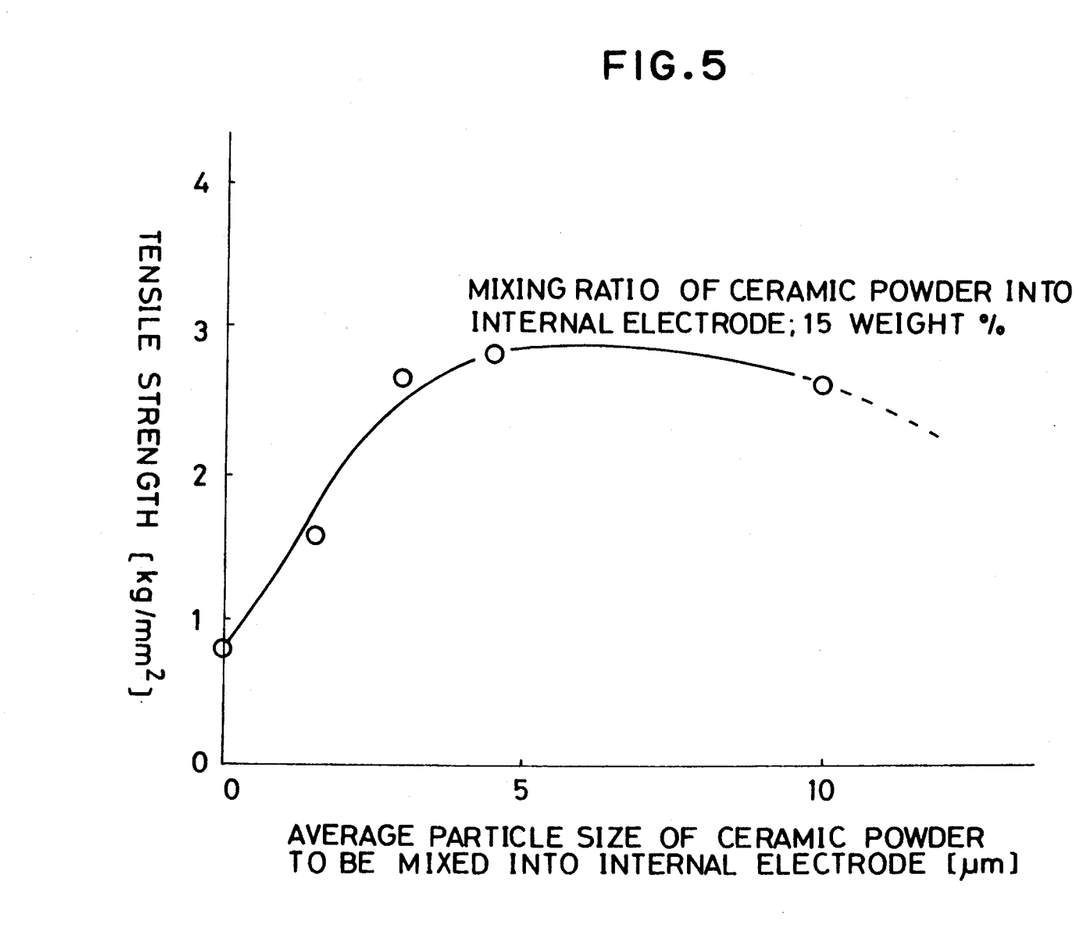
FIG. 5 shows a relation of a mixing ratio of ceramic powder into an internal electrode and a tensile strength of the actuator shown in FIG. 1.

In tests using the specimens of this invention, the relation between the average particle size of the ceramic powder to be contained within the internal electrode and the tensile strength of the specimens obtained was investigated by changing the average particle size, as shown in FIG. 5. FIG. 5 shows that tensile strength can be increased when the average particle size of the ceramic powder is ranged from one-third to one times the thickness of the internal electrode, and that such effect can be further increased when it is made to range from one-half-to-one times the thickness thereof. In addition, the reason why the data obtained when the average particle size exceeds 10 μm are not shown is that when the ceramic powder is mixed into the internal electrode, the printability of the paste prepared for making the internal electrode is largely reduced, resulting in an occurrence of filling-in the printing screen and suspending the test.

As explained above, this invention makes it possible to improve the bonding strength between the ceramic layer and internal electrode to about, for example, 1.7 times compared with that conventionally obtainable, thus being capable of obtaining a piezoelectric actuator highly resistant to an impact force.

In this embodiment, a description was provided of a piezoelectric actuator. How ever by forming the ceramic layer 1 of a material exhibiting the electrostrictive effect, it becomes possible to use it as an electrostrictive actuator.

What is claimed is:

1. A piezoelectric ceramic actuator comprising:
 a laminated body including a plurality of piezoelectric ceramic layers, and a plurality of internal electrodes, alternately laminated with the plurality of ceramic layers,
 wherein each of the plurality of internal electrodes is formed from a film containing a electroconductive material containing metals and a ceramic powder and the ceramic powder including particles having an average particle size ranging from one-third to one times a thickness of each of the respective internal electrodes, the particles of the ceramic powder causing adjacent layers of the plurality of piezoelectric ceramic layers to be cross-linked through and bonded to at least one of the plurality of internal electrodes.

2. A piezoelectric ceramic actuator having a laminated body formed by alternately laminating a plurality of piezoelectric ceramic layers and a plurality of film-shaped internal electrodes wherein each of said plurality of internal electrodes contains a ceramic powder, an average particle size of said ceramic powder ranging from one-third to one times a thickness of said each internal electrode, and a mixing ratio of said ceramic powder into each internal electrode ranging from 10 to 20 weight percent to an electroconductive material contained within said each internal electrode.

3. A piezoelectric ceramic actuator as claimed in claim 2 wherein the average particle size of said ceramic powder to be contained within said internal electrode ranges from one-half to one times the thickness of each internal electrode.

4. A piezoelectric ceramic actuator comprising:
 a laminated body including a plurality of piezoelectric ceramic layers and a plurality of internal electrodes alternately laminated with the plurality of ceramic layers,
 wherein each of the plurality of internal electrodes is formed from a film containing an electroconductive material and a ceramic powder, the ceramic powder including particles having an average particle size ranging from one-third to one times a thickness of each of the respective internal electrodes and each of the plurality of internal electrodes having a mixing ratio of the ceramic powder ranging from 10 to 20 weight percent to the electroconductive material, the particles of the ceramic powder causing adjacent layers of the plurality of piezoelectric ceramic layers to be cross-linked through and bonded to at least one of the plurality of internal electrodes.

5. A piezoelectric ceramic actuator as claimed in claim 4 wherein the ceramic powder contained within each of the plurality of internal electrodes contains particles having an average particle size ranging from one-half to one times the thickness of each of the respective internal electrodes.

6. A piezoelectric ceramic actuator as claimed in claim 4 wherein a material used to form the ceramic powder contained within the each of the plurality of internal electrodes is the same material used to form the piezoelectric ceramic layers.

7. A piezoelectric ceramic actuator as claimed in claim 5 wherein a material used to form the ceramic powder contained within the each of the plurality of internal electrodes is the same material used to form the piezoelectric ceramic layers.

8. A piezoelectric ceramic actuator as claimed in claim 4 wherein each of the plurality of internal electrodes is bonded to the adjacent ceramic layers at two opposed surfaces thereof through the particles which are protruded from the two opposed surfaces of the internal electrode.

9. A piezoelectric ceramic actuator as claimed in claim 5 wherein each of the plurality of internal electrodes is bonded to the adjacent ceramic layers at two opposed surfaces thereof through the particles which are protruded from the two opposed surfaces of the internal electrode.

10. A piezoelectric ceramic actuator as claimed in claim 6 wherein each of the plurality of internal electrodes is bonded to the adjacent ceramic layers at two opposed surfaces thereof through the particles which are protruded from the two opposed surfaces of the internal electrode.

11. A piezoelectric ceramic actuator as claimed in claim 7 wherein each of the plurality of internal electrodes is bonded to the adjacent ceramic layers at two opposed surfaces thereof through the particles which are protruded from the two opposed surfaces of the internal electrode.

12. A piezoelectric ceramic actuator as claimed in claim 4 wherein a material used to form the electroconductive material contained within the each of the plurality of internal electrodes is a powder mixture containing metals.

13. An electrostrictive-effect element comprising:
 a laminated body including a plurality of electrostrictive-effect ceramic layers, and a plurality of internal electrodes alternately laminated with the plurality of ceramic layers,
 wherein each of the plurality of internal electrodes is formed from a film containing a electroconductive material and a ceramic powder, the ceramic powder including particles having an average particle size ranging from one-third to one times a thickness of each of the respective internal electrodes and each of the plurality of internal electrodes having a mixing ratio of the ceramic powder ranging from 10 to 20 weight percent to the electroconductive material, the particles of the ceramic powder causing adjacent layers of the plurality of electrostrictive-effect ceramic layers to be cross-linked through and bonded to at least one of the plurality of internal electrodes.

14. An electrostrictive-effect element as claimed in claim 13 wherein the ceramic powder contained within each of the plurality of internal electrodes contains particles having an average particle size ranging from one-half to one times the thickness of each of the respective internal electrodes.

15. An electrostrictive-effect element as claimed in claim 13 wherein the ceramic powder contained within the plurality of internal electrodes is the same ceramic powder used to form the plurality of electrostrictive-effect ceramic layers.

16. An electrostrictive-effect element as claimed in claim 14 wherein the ceramic powder contained within each of the plurality of internal electrodes is the same ceramic powder used to form the plurality of electrostrictive-effect ceramic layers.

17. An electrostrictive-effect element as claimed in claim 13 wherein each of the plurality of internal electrodes is bonded to the adjacent electrostrictive-effect ceramic layers at two opposed surfaces thereof through the particles which are protruded from the two opposed surfaces of the internal electrode.

18. An electrostrictive-effect element as claimed in claim 14 wherein each of the plurality of internal electrodes is bonded to the adjacent electrostrictive-effect ceramic layers at two opposed surfaces thereof through the particles which are protruded from the two opposed surfaces of the internal electrode.

19. An electrostrictive-effect element as claimed in claim 15 wherein each of the plurality of internal electrodes is bonded to the adjacent electrostrictive-effect ceramic layers at two opposed surfaces thereof through the particles which are protruded from the two opposed surfaces of the internal electrode.

20. An electrostrictive-effect element as claimed in claim 16 wherein each of the plurality of internal electrodes is bonded to the adjacent electrostrictive-effect ceramic layers at two opposed surfaces thereof through the particles which are protruded from the two opposed surfaces of the internal electrode.

21. A piezoelectric ceramic actuator as claimed in claim 13 wherein a material used to form the electroconductive material contained within the each of the plurality of internal electrodes is a powder mixture containing metals.

* * * * *

UNITED STATES PATENT AND TRADEMARK OFFICE
CERTIFICATE OF CORRECTION

PATENT NO. : 5,196,757

DATED : March 23, 1993

INVENTOR(S) : Kenichi Omatsu

It is certified that error appears in the above-identified patent and that said Letters Patent is hereby corrected as shown below:

On title page, item [56], References Cited, Foreign Patent Documents, change "0519777  7/1986  Japan....310/364" to --0159777  7/1986  Japan....310/364--.

Signed and Sealed this

Seventh Day of December, 1993

Attest:

BRUCE LEHMAN

Attesting Officer

Commissioner of Patents and Trademarks